United States Patent
Mizrahi et al.

(10) Patent No.: US 11,646,063 B2
(45) Date of Patent: May 9, 2023

(54) SYSTEM FOR IMPLEMENTING SHARED LOCK FREE MEMORY IMPLEMENTING COMPOSITE ASSIGNMENT

(71) Applicant: JERUSALEM COLLEGE OF TECHNOLOGY, Jerusalem (IL)

(72) Inventors: Shimon Mizrahi, Jerusalem (IL); Raphael Berakhael Yehezkael, Jerusalem (IL); Ruben Attia, Modi'in (IL); Erez Lax, Ariel (IL); Devora Berlowitz, Shoham (IL); Moshe Goldstein, Jerusalem (IL); David Dayan, Jerusalem (IL)

(73) Assignee: JERUSALEM COLLEGE OF TECHNOLOGY, Jerusalem (IL)

( * ) Notice: Subject to any disclaimer, the term of this patent is extended or adjusted under 35 U.S.C. 154(b) by 0 days.

(21) Appl. No.: 17/262,365

(22) PCT Filed: Jul. 24, 2019

(86) PCT No.: PCT/IL2019/050842
§ 371 (c)(1),
(2) Date: Jan. 22, 2021

(87) PCT Pub. No.: WO2020/021551
PCT Pub. Date: Jan. 30, 2020

(65) Prior Publication Data
US 2021/0225416 A1    Jul. 22, 2021

Related U.S. Application Data

(60) Provisional application No. 62/702,373, filed on Jul. 24, 2018.

(51) Int. Cl.
*G11C 7/10* (2006.01)
*G11C 7/22* (2006.01)
(Continued)

(52) U.S. Cl.
CPC ............ *G11C 7/1012* (2013.01); *G06F 12/00* (2013.01); *G11C 7/1051* (2013.01);
(Continued)

(58) Field of Classification Search
USPC ............................................. 365/149, 189.04
See application file for complete search history.

(56) References Cited

U.S. PATENT DOCUMENTS 5,883,841 A      3/1999   Wendell
7,746,109 B1 *   6/2010   Young .............. H03K 19/17736
                                                          326/38
(Continued)

FOREIGN PATENT DOCUMENTS

EP        1050822        11/2000
JP        H06243111      9/1994
(Continued)

OTHER PUBLICATIONS

International Search Report for PCT/IL2019/050842 dated Nov. 14, 2019.
(Continued)

*Primary Examiner* — Tan T. Nguyen
(74) *Attorney, Agent, or Firm* — Pearl Cohen Zedek Latzer Baratz LLP

(57) ABSTRACT

It is an object of the disclosed technique to provide a novel method and system for shared concurrent access to a memory cell. In accordance with the disclosed technique, there is thus provided a system for shared concurrent access to a memory cell, which includes at least one shared memory cell, an evaluator and a plurality of processing agents coupled to the input of the evaluator. The evaluator is further coupled with the at least one memory cell. The evaluator is configured to evaluate an expression for performing multiple concurrent composite assignments on the at least one shared (Continued)

memory cell. The evaluator further allows each of the plurality of processing agents to perform concurrent composite assignments on the at least one shared memory cell. The composite assignments do not include a read operation of the at least one shared memory cell by the plurality of processing agents.

12 Claims, 12 Drawing Sheets

(51) Int. Cl.
*H03K 19/20* (2006.01)
*G06F 12/00* (2006.01)
*G06F 9/46* (2006.01)
*G06F 11/07* (2006.01)
*G06F 13/38* (2006.01)

(52) U.S. Cl.
CPC .............. *G11C 7/1078* (2013.01); *G11C 7/22* (2013.01); *H03K 19/20* (2013.01); *G06F 9/46* (2013.01); *G06F 9/466* (2013.01); *G06F 11/0724* (2013.01); *G06F 13/38* (2013.01)

(56) References Cited

U.S. PATENT DOCUMENTS 8,108,625 B1   1/2012   Coon et al.
2015/0357030 A1   12/2015   Iyer et al.
2017/0345505 A1*   11/2017   Noel .................. G11C 8/16

FOREIGN PATENT DOCUMENTS

KR   20130003855   1/2013
WO   WO2013100928   7/2019

OTHER PUBLICATIONS

R. B. Yehezkael, M. Goldstein, D. Dayan and S. Mizrahi, "Flexible Algorithms: Enabling Well-Defined Order-Independent Execution with an Imperative Programming Style," 2015 4th Eastern European Regional Conference on the Engineering of Computer Based Systems, 2015, pp. 75-82.

European Search Report for Application No. EP19842058.0, dated Sep. 15, 2022.

D. Dayan et al., "EFL Implementing and Testing an Embedded Language Which Provides Safe and Efficient Parallel Execution," *2015 4th Eastern European Regional Conference on the Engineering of Computer Based Systems*, 2015, pp. 83-90.

M.Goldstein, D. Dayan, M. Rabin, D. Berlovitz, R. B. Yehezkael "Design Principles of an Embedded Language (EFL) Enabling Well Defined Order-Independent Execution", in Proc. Of the 5th European Conference on the Engineering of Computer Based Systems , pp. 1-8, Aug. 2017.

* cited by examiner

SYSTEM FOR IMPLEMENTING SHARED LOCK FREE MEMORY IMPLEMENTING COMPOSITE ASSIGNMENT

CROSS REFERENCE TO RELATED APPLICATIONS

This application is a National Phase Application of PCT/IL2019/050842, International Filing Date Jul. 24, 2019, claiming the benefit of U.S. Provisional Patent Application No. 62/702,373 filed on Jul. 24, 2018, all of which are incorporated herein by reference in their entirety.

FIELD OF THE DISCLOSED TECHNIQUE

The invention relates to flexible computation in general, and to systems and methods for implementing concurrent flexible computation, in particular.

BACKGROUND OF THE DISCLOSED TECHNIQUE

A basic tenet for implementing flexible computation requires well-defined results. With well-defined flexible execution, the final value is unaffected by the order of executing any one of a program's instructions, allowing instructions to be executed in series, parallel, or various combination thereof. Flexible execution can be realized by adapting the rules governing the scope of variables, as affecting address definitions, variable initialization, and reading and writing. Variables updated using this specialized instruction set are guaranteed to yield consistent, well-defined results for any permitted sequence of execution. Examples of instructions that can comply with these restrictions are: once-only assignments, logical OR operations, and addition "+". These instructions are commutative and associative; and may be combined in any order to yield consistent, well-defined outputs.

Given an operator f, composite assignments have the form $xf=y$, or $x=(x\ f\ y)$. The Unordered Sequential Composite Assignment Execution (USCAE) condition, is a requirement for implementing well-defined execution for composite assignments of the form $xf=y$, when the composite assignments are executed sequentially in any order. The USCAE operator condition requires that $((afb)fc)=((afc)fb)$, e.g. the exact addition operator satisfies this condition and such a composite assignment is written: $x+=y$, short for $x=x+y$. While the first parameter and the value of f must be of the same type, no restriction is placed on the second parameter of f. These operators are referred to herein as USCAE operators. Examples of functions satisfying this condition are logical AND and OR operators, the exact arithmetic operations $+, -, *, /, **$, addition and subtraction with respect to a fixed modulus, and the like. Certain composite assignments, for example, OR=, and AND=, may also be executed in parallel, by utilizing electrical properties of capacitors and semiconductors as we shall see in this disclosure.

The USCAE condition can be expanded for a plurality of different operators. For example, given operators $f_1, f_2$, which may be the same or different, the USCAE function condition can be expressed as follows: $((a,f_1,b)f_2,c)=((a,f_2,c)f_1,b)$. And this easily generalizes for n operators, be they the same or different. Complying with these conditions allows for considerable execution flexibility while ensuring a uniquely defined, deterministic output. For further details see the first publication.

PUBLICATIONS

The publication "Flexible Algorithms: Enabling Well-defined Order-Independent Execution with an Imperative Programming Style", in Proc. of the 4th Eastern European Regional Conference on the Engineering of Computer Based Systems (ECBS-EERC 2015). IEEE Press, 75-82 (DOI: 10.1109/ECBS-EERC.2015.20), R. B. Yehezkael, M. Goldstein, D. Dayan, S. Mizrahi, latest version available at http://flexcomp.jct.ac.il/Publications/Flexalgo&Impl_1.pdf The publication "EFL: Implementing and Testing an Embedded Language Which Provides Safe and Efficient Parallel Execution", in Proc. of the 4th Eastern European Regional Conference on the Engineering of Computer Based Systems (ECBS-EERC 2015), IEEE Press, 83-90 (DOI: 10.1109/ECBS-EERC.2015.21), D. Dayan, M. Goldstein, M. Popovic, M. Rabin, D. Berlovitz, O. Berlovitz, E. Bosni-Levy, M. Neeman, M. Nagar, D. Soudry, R. B. Yehezkael. 2015, latest version available at http://flexcomp.jct.ac.il/Publications/EFLimplementation_and_Testing.pdf The publication "Design Principles of an Embedded Language (EFL) Enabling Well Defined Order-Independent Execution", in Proc. of the 5th European Conference on the Engineering of Computer Based Systems (ECBS 2017), ACM (DOI: 10.1145/3123779.3123789), M. Goldstein, D. Dayan, M. Rabin, D. Berlovitz, R. B. Yehezkael, latest version available at http://flexcomp.jct.ac.il/Publications/EFLprinciples.pdf

SUMMARY OF THE PRESENT DISCLOSED TECHNIQUE

It is an object of the disclosed technique to provide a novel method and system for shared concurrent access to a memory cell. In accordance with the disclosed technique, there is thus provided a system for shared concurrent access to a memory cell, which includes at least one shared memory cell, an evaluator and a plurality of processing agents coupled to the input of the evaluator. The evaluator is further coupled with the at least one memory cell. The evaluator is configured to evaluate an expression for performing multiple concurrent composite assignments on the at least one shared memory cell. The evaluator further allows each of the plurality of processing agents to perform concurrent composite assignments on the at least one shared memory cell. The composite assignments do not include a read operation of the at least one shared memory cell by the plurality of processing agents.

In accordance with another aspect of the disclosed technique, there is thus provided a system for shared concurrent access to a memory cell, which includes at least one shared memory cell, a logic circuit and a plurality of processing agents coupled to the input of the logic circuit. The logic circuit is further coupled with the at least one memory cell. The logic circuit is configured to perform one of OR= and AND= multiple concurrent composite assignments on the at least one shared memory cell. The logic circuit allows each of the plurality of processing agents to perform concurrent composite assignments on the at least one shared memory cell. The composite assignment does not include a read operation of the at least one shared memory cell by the plurality of processing agents.

In accordance with a further aspect of the disclosed technique, there is thus provided a one bit memory cell, which receives a write signal corresponding to the logical ANDs of the data to be written with corresponding write enable signals.

In accordance with another aspect of the disclosed technique, there is thus provided a one bit memory cell, which includes a line associated with each processing agent. The line being for enabling read from the memory cell and for writing ones to the memory cell.

In accordance with a further aspect of the disclosed technique, there is thus provided a processor for executing machine executable instructions relating to the OR=multiple concurrent composite assignments where for a first bit x and a second bit y, the composite assignment implemented by a statement selected from the group consisting of:
  if y==1 then x=1;
  if y==1 then x=1 else x=x;
  if y==1 then x=y; and
  if y==1 then x=y else x=x.

In accordance with a further aspect of the disclosed technique, there is thus provided a processor for executing machine executable instructions relating to the AND=multiple concurrent composite assignments where for a first bit x and a second bit y, the composite assignment implemented by a statement selected from the group consisting of:
  if y==0 then x=0;
  if y==0 then x=0 else x=x;
  if y==0 then x=y; and
  if y==0 then x=y else x=x.

BRIEF DESCRIPTION OF THE DRAWINGS

The disclosed technique will be understood and appreciated more fully from the following detailed description taken in conjunction with the drawings in which.

DETAILED DESCRIPTION OF THE EMBODIMENTS

Figure 1A:
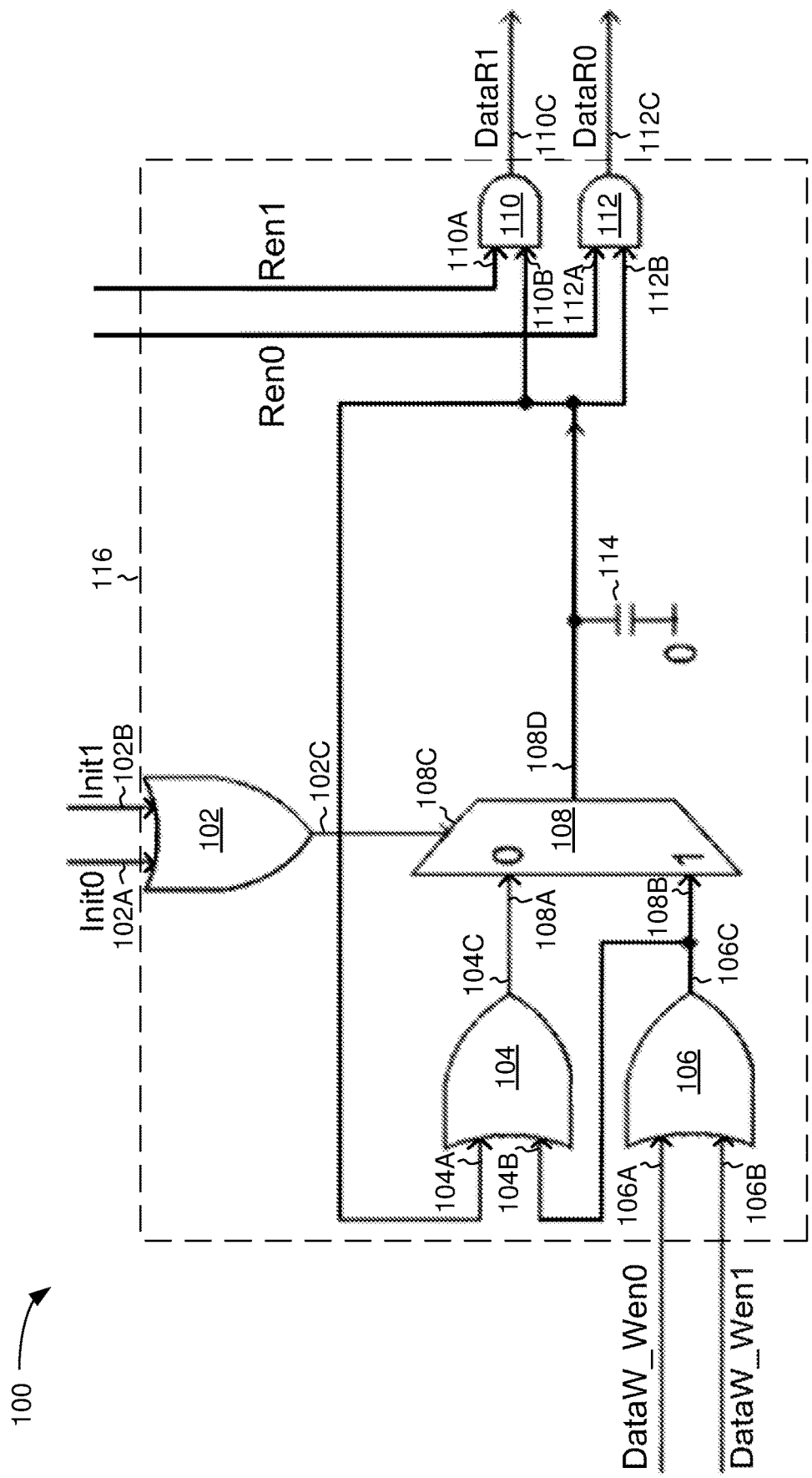
FIG. 1A is a schematic illustration of a system for implementing concurrent OR= instructions on a shared one-bit DRAM memory cell, constructed and operative in accordance with an embodiment of the disclosed technique.

The disclosed technique overcomes the disadvantages of the prior art by providing a novel technique for implementing well-defined computation by multiple parallel processors. A shared memory architecture is presented to enable multiple processors to access a memory cell concurrently. The multiple, concurrent composite assignments are performed on the shared memory cell without requiring the memory cell to be locked from access by any of the multiple processors. This can be useful for a variety of scenarios, such as setting one or more flags. Often it is sufficient to know that a flag was set by at least one of the processors, without needing to know which of the processors set the flag.

The instruction set for implementing the parallel memory access technique disclosed herein relates to performing a logical OR=operation, and complies with the flexible execution criterion described above. Storing the results of a well-defined computation requires preserving the previous value. The memory hardware architecture disclosed herein is configured to implement an OR=instruction on a shared memory cell such that the new result does not replace the previously stored data. Rather, data written to memory is logically OR'd with the current value stored in the memory. Since OR= instructions are well-defined, the result is indifferent to the order of execution. Furthermore, the memory cell does not have to be read prior to writing the result of an OR. Thus, multiple processors can read and/or write to the shared memory concurrently, avoiding conflicts typically found in parallel computing.

The disclosed architecture may be implemented on a system with multiple processing cores operating in parallel, or on a single processing core running multiple parallel processing threads. For the purpose of clarity, the techniques disclosed herein will refer to multiple core (e.g. hardware) processors; however, it is to be understood that the techniques are equally relevant to virtual processors, processing threads, and the like. The disclosed technique may be software implemented, hardware implemented, or programmable-hardware implemented. The memory cell and any controlling logic may be implemented using suitable hardware componentry. For example, the memory cell may be implemented using one or more capacitors, or flip flops, and the controlling logic may include one or more diodes, OR gates, AND gates, and the like.

In one embodiment, the shared memory is implemented by limiting the instruction set of the multiple processors to OR=operations, however this is not intended to be limiting and the technique may be modified to accommodate additional operations, such as a logical AND. For one bit variables, an x OR=y operation, may be implemented with any of the following statements, where the symbol '==' denotes equality and the symbol '=' denotes assignment:
  a) If y==1 then x=1
  b) If y==1 then x=1, else x=x
  c) If y==1 then x=y
  d) If y==1 then x=y, else x=x.

As can be seen from the above rules, OR= instructions comply with the requirements of well-defined computation. A processor does not need to read the current value of a memory cell prior to OR='ing a new value with the current value. Since the result of the computation is indifferent to the order of execution, multiple processors can perform a separate OR=operation on the shared memory cell concurrently, without requiring the shared memory to be locked, allowing for concurrent updates. An x AND=y statement may also be implemented with statements similar to statements a), b), c) and d) above, by replacing the ones with zeros, as follows:
  a) If y==0 then x=0
  b) If y==0 then x=0, else x=x
  c) If y==0 then x=y
  d) If y==0 then x=y, else x=x It is also noted that the disclosed technique may be implemented by machine executable instructions (e.g. software using the above rules or using an emulator).

In the description which follows, a zero voltage is interpreted as false and also referred to as 'zero' or 'low'. A non-zero voltage is interpreted as a true and referred to as 'one' or 'high'. The disclosed technique is first presented employing the OR=operation. The disclosed technique also applies to the AND=operation by interpreting zero voltage values as true and non-zero voltages as false, with no change to the circuits used. By changing the circuit, it also applies to any USCAE operator. It is also noted that OR= and AND=assignments do not include an internal feedback in the memory cell. Also, a memory cell implementing OR= may include a line associated with each processing agent which enables both read from the memory cell and writing ones to the memory cell.

Reference is now made to FIG. 1A, which is a schematic illustration of a system, generally referenced 100, for implementing concurrent OR=composite assignment on a shared one-bit DRAM memory cell, constructed and operative in accordance with an embodiment of the disclosed technique. System 100 enables executing one or more OR=composite assignment on a DRAM memory cell as well as initializing the DRAM memory to either zero or one. System 100 includes a DRAM memory cell for implementing concurrent OR=composite assignment, indicated by dashed line 116, an initializing OR gate 102, an OR gate 104, an OR gate 106, a multiplexer 108, AND gates 110, and 112, and capacitor 114. Initializing OR gate 102 has two inputs 102A and 102B and an output 102C. OR gate 104 has two input 104A and 104B and an output 104C. OR gate 106 has two input 106A and 106B and an output 106C. Multiplexer 108 has an input 108A labeled "0", and an input 108B labeled "1". Initializing input 108C, and an output 108D. AND gate 110 has two inputs 110A, 110B, and an output 110C. AND gate 112 has two inputs 112A, 112B, and an output 112C.

Initializing OR gate 102 receives an "Init0" via input 102A from a first processor (not shown), and an "Init1" via input 102B from a second processor (not shown). Initializing OR gate 102 allows the first and/or the second processor to send a value (i.e. Init0 from the first processor, and Init1 from the second processor) directly to the memory cell without performing an OR=operation, such as for initialization purposes. Output 102C of initializing OR gate 102 is electrically coupled to input 108D of multiplexer 108 which receives the initializing signal and when this in "1", it writes the output of OR gate 106 to the memory cell accordingly. OR gate 106 receives from the first processor, a logical AND of the data to be written to memory cell 116 with the write enable signal, labeled DataW_Wen0, at input 106A. OR gate 106 receives from the second processor, a logical AND of the data to be written to memory cell 116 with the write enable signal, labeled DataW_Wen1, at input 106B. OR gate 106 performs a logical OR on the DataW_Wen0 signal and the DataW_Wen1 signal. Output 106C of OR gate 106 is electrically coupled to input 104B of OR gate 104, and additionally to input 108B of multiplexer 108, labeled "1". Input 104A of OR gate 104 is electrically coupled in a feedback loop to output 108D of multiplexer 108, i.e. the current value of capacitor 114. OR gate 104 performs a logical OR on the output from OR gate 106 (i.e. the logical OR of the input signals from the first and second processors) and the contents of the memory cell, thereby implementing an OR=operation. Output 104C of OR gate 104 is electrically coupled to input 108A of multiplexer 108, labeled "0". Output 108D of multiplexer 108 is electrically coupled to capacitor 114 and input 104A of OR gate 104. In this manner the values received from the first processor and second processor are OR'd with the contents of the memory cell, to implement an OR=write operation.

To implement an OR=read operation, capacitor 114 is electrically coupled to input 110B of AND gate 110, and input 112B of AND gate 112. AND gate 110 receives a read enabled signal, Ren1 at input 110A from the second processor. AND gate 112 receives a read enabled signal, Ren0 at input 112A from the first processor. AND gate 112 performs a logical AND operation on the contents of the memory cell and the value of Ren0, allowing the first processor to read the contents of the memory cell when Ren0 is turned on (i.e. when Ren0=1). The first processor is electrically coupled to output 112C, and receives DataR0 thereby reading the contents of the memory cell. AND gate 112 performs a logical AND operation on the contents of the memory cell with the value of Ren0, allowing the first processor to read the contents of the memory cell when Ren0 is turned on (i.e. when Ren0=1). The second processor is electrically coupled to output 110C, and receives DataR1 thereby reading the contents of the memory cell. The OR=operation is implemented with logic that is integrated within shared memory cell 116, and is external to the processor. The logic is implemented using a feedback loop that couples the current value of the capacitor 114 to OR gate 104 feeding multiplexer 108. The read-enable lines receive inputs from outside the shared memory cell 116.

Figure 1B:
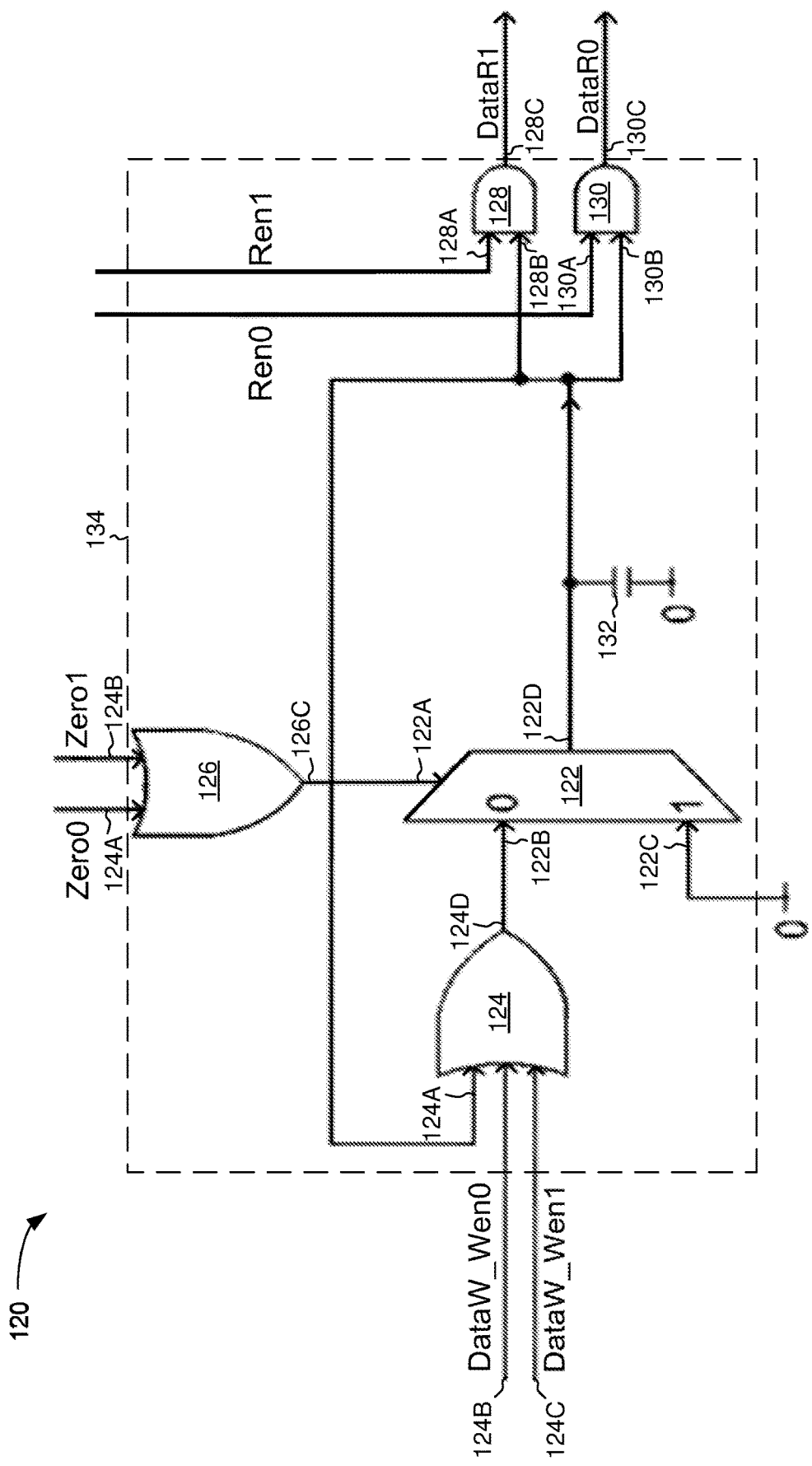
FIG. 1B is a schematic illustration of a system for implementing concurrent OR= instructions on a shared one-bit DRAM memory cell, constructed and operative in accordance with another embodiment of the disclosed technique.

Reference is now made to FIG. 1B, which is a schematic illustration of a system, generally referenced 120, for implementing concurrent OR=composite assignment on a shared one-bit memory cell, constructed and operative in accordance with another embodiment of the disclosed technique. System 120 enables executing one or more OR=composite assignment on a DRAM memory and enables the initialization of DRAM memory to zero. System 120 includes a memory cell for implementing concurrent OR=composite assignment, indicated by dashed line 134, a multiplexer 122, an OR gate 124, an initializing OR gate 126, AND gates 128 and 130, and a capacitor 132. Multiplexer 122 has initializing input 122A, input 122B corresponding to 0, input 122C corresponding to 1, and output 122D. OR gate 124 has inputs 124A, 124B, 124C, and an output 124D. Initializing OR gate 126 has inputs 126A, 126B, and an output 126C. AND gate 128 has inputs 128A, 128B and an output 128C. AND gate 130 has inputs 130A, 130B, and an output 130C.

Initializing OR gate 126 receives a Zero0 signal via input 124A from a first processor (not shown), and a Zero1 signal at input 124B from a second processor (not shown). Initializing OR gate 126 allows the first and second processor to zero the memory cell without performing an OR=operation, such as for initialization purposes. Output 126C of initializing OR gate 126 is electrically coupled to input 122A of multiplexer 122 which receives the initializing signal and writes zero to the memory cell accordingly. OR gate 124 receives from the first processor, a logical AND of the data to be written to memory cell 134 with the write enable signal, labeled DataW_Wen0, at input 124B from the first processor. Or gate 124 receives from the second processor, a logical AND of the data to be written to memory cell 134 with the write enable signal, labeled DataW_Wen1, at input 124C from the second processor. OR gate 124 performs a logical OR on the DataW_Wen0 signal and the DataW_Wen1 signal. Input 124A of OR gate 124 is electrically coupled to output 122D of multiplexer 122, i.e. the value of capacitor 132, in a feedback loop, thereby implementing an OR=operation between the input signal and the contents of the memory cell. Output 124D of OR gate 124 is electrically coupled to input 122B of multiplexer 122, corresponding to 0. Input 122C of multiplexer, corresponding to 1 is connected to ground. Output 122D of multiplexer is electrically coupled to capacitor 132, and input 124A of OR gate 124. In this manner the values received from the first processor and second processor are OR'd with the contents of the memory cell, to implement an OR=write operation.

To implement an OR=read operation, capacitor 132 is electrically coupled to input 128B of AND gate 128 and input 130B of AND gate 130. AND gate 128 receives a read enabled signal, Ren1 at input 128A from the second processor. AND gate 130 receives a read enabled signal, Ren0 at input 130A from the first processor. AND gate 130 performs a logical AND operation on the contents of the memory cell and the value of Ren0, allowing the first processor to read the contents of the memory cell when Ren0 is turned on (i.e. when Ren0=1). The first processor is electrically coupled to output 130C, and receives DataR0 thereby reading the contents of the memory cell. AND gate 128 performs a logical AND operation on the contents of the memory cell with the value of Ren1, allowing the second processor to read the contents of the memory cell when Ren1 is turned on (i.e. when Ren1=1). The second processor is electrically coupled to output 128C, and receives DataR1 thereby reading the contents of the memory cell. The OR=operation is implemented with logic that is integrated within shared memory cell 134, and is external to the processors. The logic is implemented using a feedback loop that couples the current value of the capacitor 132 to OR gate 124 feeding multiplexer 122. The read-enable lines receive inputs from outside the shared memory cell 134.

Figure 1C:
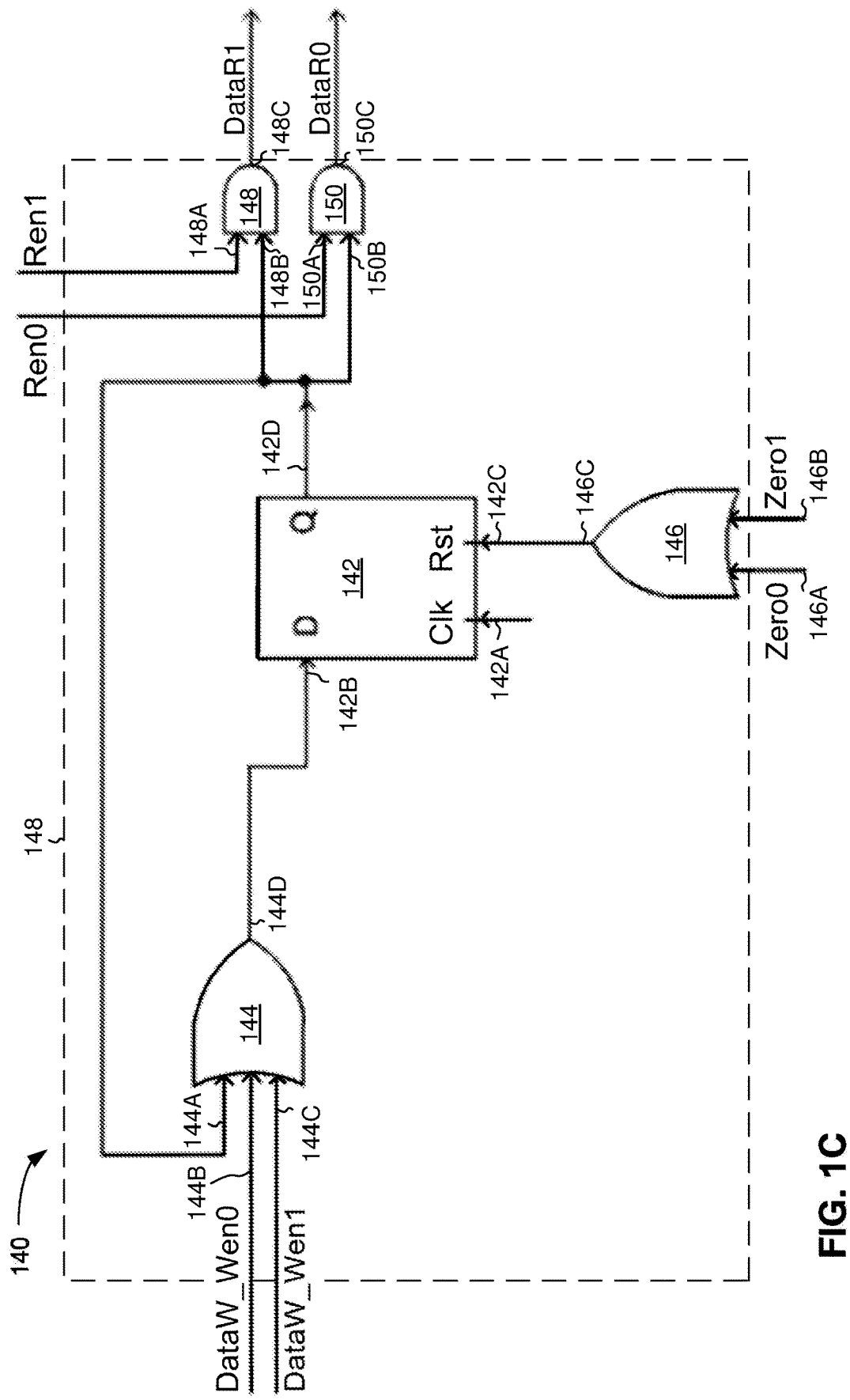
FIG. 1C is a schematic illustration of a system for implementing concurrent OR= instructions on a shared one-bit SRAM memory cell, constructed and operative in accordance with a further embodiment of the disclosed technique.

Reference is now made to FIG. 1C, which is a schematic illustration of a system, generally referenced 140, for implementing concurrent OR=composite assignment on a shared one-bit SRAM memory cell, constructed and operative in accordance with a further embodiment of the disclosed technique. System 140 is notably similar in functionality to systems 100 and 120 of FIGS. 1A-1B with the notable difference that a flip flop 142 (static bit) replaces capacitors 114 and 132 (dynamic bit). System 140 enables executing one or more OR=composite assignment on a shared SRAM memory and enables the initialization of the SRAM memory to zero. System 140 includes a shared memory cell for implementing an OR=composite assignment, indicated by dashed line 148, flip flop 142, an OR gate 144, an OR gate 146, and AND gates 148 and 150. Flip flop has inputs 142A, 142B, 142C, and output 142D. OR gate has inputs 144A, 144B, 144C, and output 144D. OR gate 146 has inputs 146A and 146B, and output 146C. AND gate 148 has inputs 148A, 148B, and output 148C. AND gate 150 has inputs 150A, 150B, and output 150C.

Reset OR gate 146 receives a Zero0 signal via input 146A from a first processor (not shown), and/or a Zero1 signal at input 146B from a second processor (not shown). Reset OR gate 146 allows the first and/or the second processor to reset the memory cell to zero only. Reset OR gate 146 performs a logical OR on the Zero0 and Zero1 values. Output 146C of reset OR gate 146 is electrically coupled to flip flop 142 at input 142C, corresponding to the reset signal (Rst) of the memory cell. Input 142A of flip flop 142 may receive a clock signal (Clk) for synchronization.

OR gate 144 receives from the first processor, a logical AND of the data to be written to memory cell 148 with the write enable signal, labeled DataW_Wen0, at input 144B from the first processor. OR gate 144 receives from the second processor, a logical AND of the data to be written to memory cell 148 with the write enable signal, labeled DataW_Wen1, at input 144C from the second processor. Input 144A of OR gate 144 is electrically coupled in a feedback loop with output 142D of flip flop 142, thereby performing a logical OR on the contents of the memory cell with the input signals to implement an OR=operation. Output 144D of OR gate 144 is electrically coupled to input 142B of flip flop 142. In this manner the values received from the first processor and second processor are OR'd with the contents of the memory cell, to implement an OR=write operation.

To implement an OR=read operation, output 142D of flip flop 142 is electrically coupled to input 148B of AND gate 148, and input 150B of AND gate 150. AND gate 148 receives a read enabled signal, Ren1 at input 148A from the second processor. AND gate 150 receives a read enabled signal, Ren0 at input 150A from the first processor. AND gate 150 performs a logical AND operation on the contents of the memory cell and the value of Ren0, allowing the first processor to read the contents of the memory cell when Ren0 is turned on (i.e. when Ren0=1). The first processor is electrically coupled to output 150C, and receives DataR0 thereby reading the contents of the memory cell. AND gate 148 performs a logical AND operation on the contents of the memory cell with the value of Ren1, allowing the second processor to read the contents of the memory cell when Ren1 is turned on (i.e. when Ren1=1). The second processor is electrically coupled to output 148C, and receives DataR1 thereby reading the contents of the memory cell. The OR=operation is implemented with logic that is integrated with the shared memory cell 148, external to the processor. The logic is implemented using a feedback loop that couples the current value of the memory cell with the input values DataW_Wen0 and DataW_Wen1, i.e. output 142D of flip flop 142 is coupled to OR gate 144, feeding input 142B of flip flop 142. The read-enable lines receive inputs from outside the shared memory cell 148.

Figure 1D:
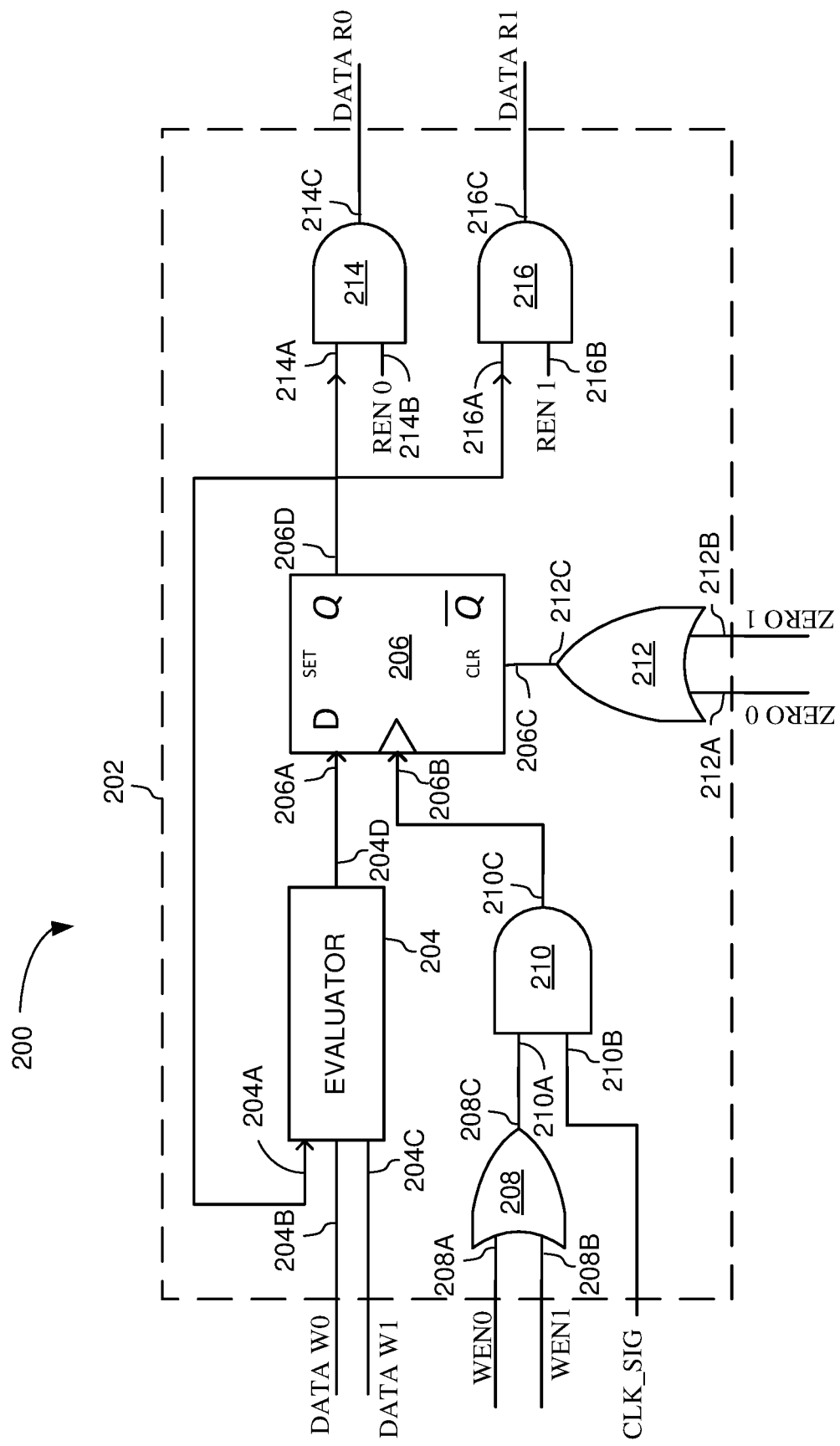
FIG. 1D is a schematic illustration of a system for implementing a composite assignment on a shared one-bit SRAM memory cell, constructed and operative in accordance with another embodiment of the disclosed technique.

Reference is now made to FIG. 1D, which is a schematic illustration of a system, generally referenced 200, for implementing a composite assignment on a shared one-bit SRAM memory cell, constructed and operative in accordance with another embodiment of the disclosed technique. System 200 is notably similar in functionality to systems 100, 120 and 140 of FIGS. 1A-1C with the notable difference that system 200 implements a composite assignment f=, where f is an USCAE operator having a right identity element (e.g., XOR operation with right identity element zero). System 200 enables executing one or more Boolean operations on a shared SRAM memory and enables the initialization of the SRAM memory to zero. System 200 includes a shared memory cell 202 for implementing the composite assignment. Shared memory cell 202 includes an evaluator 204, a flip-flop 206, a write enable OR gate 208, a clock AND gate 210, a clear OR gate 212, a first read AND gate 214 and a second read AND gate 216.

The input 206A of flip-flop 206 is coupled with the output 204D of evaluator 204. The input 206B of flip-flop 206 is coupled with the output 210C of clock AND gate 210. The input 206C of flip-flop 206 is coupled with the output 212C of clear OR gate 212. The output 206D of flip-flop 206 is coupled with the input 204A of evaluator 204, with the input 214A of first read AND gate 214 and with the input 216A of second read AND gate 216. The output 208C of write enable OR gate 208 is coupled with the input 210A of clock AND gate 210.

Input 204B of evaluator 204 is configured to receive a first data signal (demarked 'DATA_W0' in FIG. 1D) from a first processor and input 204C of evaluator 204 is configured to receive a second data signal (demarked 'DATA_W1' in FIG. 1D) from a second processor. Input 208A of write enable OR gate 208 is configured to receive a first write enable signal (demarked 'WEN0' in FIG. 1D) from the first processor and input 208B of write enable OR gate 208 is configured to receive a second write enable signal (demarked 'WEN1' in FIG. 1D) from the second processor. Input 210B of clock OR gate receives a clock signal (demarked 'CLK_SIG' in FIG. 1D) common to system 200, the first processor and the second processor. Input 212A of clear OR gate 212 is configured to receive a first clear memory signal (demarked 'ZERO O' in FIG. 1D) from the first processor and input 212B of clear OR gate 212 is configured to receives a second clear memory signal (demarked 'ZERO 1' in FIG. 1D) form the second processor. Input 214B of read enable AND gate 214 is configured to receives a first read enable signal (demarked 'REN 0' in FIG. 1D) from the first processor and input 216B of read enable AND gate 216 is configured to receives a first read enable signal (demarked 'REN 1' in FIG. 1D).

Evaluator 204 receives DATA W0, DATA W1 and the current value of output 206D of flip-flop 206 and evaluates ((206D f DATA W0) f DATA W1), and producing the result on output line 204D. To write a value to shared memory cell 202, write enable OR gate 208, performs an OR operation on the inputs 208A and 208B thereof. Clock OR gate 210 performs an AND operation on CLK_SIG and the output 208C of write enable OR gate 208. Thus, when WEN0 or WEN1 is high, and CLK_SIG is high, then the input 206A of flip-flop 206, which was received from output 204D of evaluator 204 propagates through flip-flop 206 to the output 206D thereof. The output 206D of flip-flop 206 clears when Zero 0 or Zero 1 high.

When the first processor requires to read a value from shared memory cell 202, the first processor sets REN 0 to high and the output 206D of flip-flop 206 propagates through read enable AND gate 214. When the second processor requires to read a value from shared memory cell 202, the second processor sets REN 1 to high and the output 206D of flip-flop 206 propagates through read enable AND gate 216.

Figure 2:
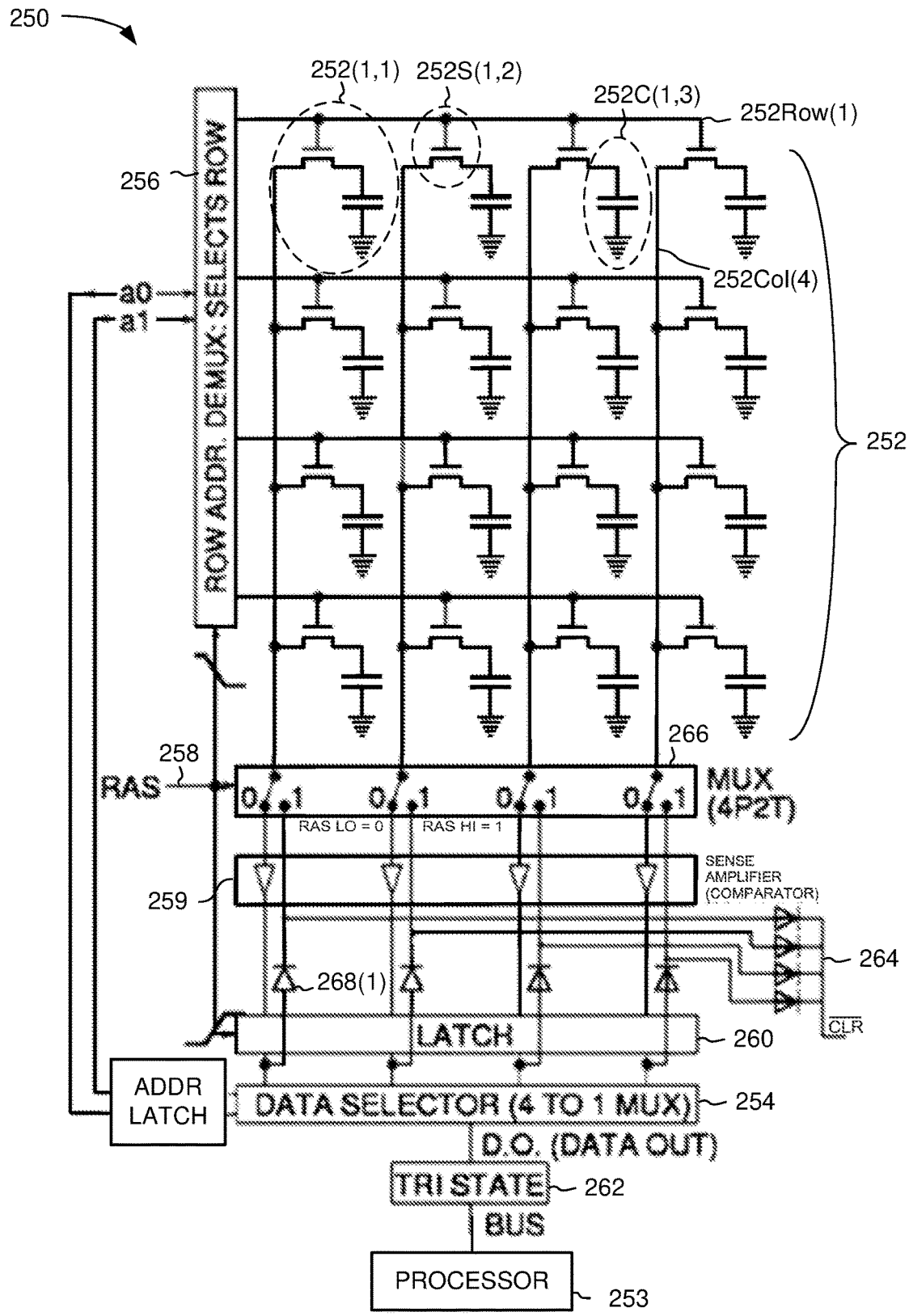
FIG. 2 is a schematic illustration of an OR-memory DRAM accessed by a single processing core running multiple threads, constructed and operative in accordance with a further embodiment of the disclosed techniques.

Reference is now made to FIG. 2, which is a schematic illustration of a system, generally referenced 250, for implementing OR=instructions on a DRAM memory unit accessed by a single core processor, constructed and operative in accordance with a further embodiment of the disclosed technique. System 250 includes a dynamic memory array 252, a processor 253, a data selector 254, a row selector 256, a Row Address Strobe (RAS) line 258, sense amplifier/comparator 259, a latch 260, a TRI state bus 262, a clear line 264 (active low), and a Multiplexer (MUX) 266. System 250 further includes a set of write diodes 268(j), e.g. write diode 268(1) is indicated controlling reading for column 1. Due to space considerations, only write diode 268(1) is labeled however the remaining write diodes 268(2), 268(3), 268(4) (not labeled) corresponding to columns 2 through 4, from left to right. Memory array 252 includes memory cells 252(i,j), where i indicates the rows of memory 252 and j indicates the columns of memory 252, e.g. the memory cell at the top left corner, corresponding to row 1, column 1 is indicated by a dashed circle labeled 252(1,1). Memory array 252 is shown having sixteen memory cells 252(i,j) arranged in a 4×4 grid, however, this is it not intended to be limiting. Each of memory cells 252(i,j) includes a switch 252S(i,j) and a capacitor 252C(i,j) such that memory array includes an array of 16 switches coupled to 16 capacitors, e.g. the switch for memory cell 252(1,2) corresponding to the first row, second column is indicated by a dashed circle, labeled 252S(1,2). Similarly the capacitor for memory cell 252(1,3) corresponding to the first row, third column is indicated by a dashed circle, labeled 252C (1,3). In FIGS. 3A-3G, switches are exemplified as Field Effect Transistors (FETs). It is however noted that the switches may be implemented by Bipolar Junction Transistors (BJTs) depending on system specifications and requirements. Memory array 252 additionally includes multiple row buses 252Row(i) and multiple column buses 252Col(j). Only the top row 252Row(1) and the fourth column 252Col (4) have been labeled due to space limitations, however it is to be understood that memory array includes four row enable lines, from top to bottom: 252Row(1), 252Row(2), 252Row(3), and 252Row(4); and four column buses, from left to right: 252Col(1), 252Col(2), 252Col(3), and 252Col (4).

Processor 253 is electrically coupled to memory 252 via TRI state bus 262 and data selector 254. For any given row i and column j of memory array 252, an input terminal of capacitor 252C(i,j) is electrically coupled to the respective first terminal (e.g., the collector of a p-type Bipolar Junction Transistor—BJT or the drain of a p-type Filed Effect Transistor—FET) of switch 252S(i,j) and an output terminal of capacitor 252C(i,j) is electrically coupled to a ground or reference voltage. Along any row i of memory array 252, the control terminals (e.g., the base of a BJT or the gate of a FET) of switches 252S(i,j) for all columns j are electrically coupled to enable line 252Row(i), e.g. the control terminal to switches 252S(1,j) are electrically coupled by enable line 252Row(1). For any given column j of memory array 252, the second terminals (e.g., the emitter of a p-type BJT or the source of an p-type FET) of switches 252S(i,j) for all rows i are electrically coupled by column bus 252Col(j), e.g. the second terminal of switches 252S(i,4) are electrically coupled by column bus 252Col(4). Row selector 256 is electrically coupled to all row enable lines 252Row(i). RAS line 258 is electrically coupled to MUX 266. All column buses 252Col(j) are coupled to MUX 266. The zero lines of MUX 266 Zero are coupled to sense amplifier/comparator 259, the one lines of MUX 266 are coupled to respective write diodes 268(j). Sense amplifier/comparator 259 is electrically coupled to latch 260. Latch 260 is electrically coupled to data selector 254. Data selector 254 is electrically coupled to row selector 256.

Each row i of memory array 252 implements a four bit word, each bit represented by memory cell 252(i,j) of row i. The switches 252S(i,j) are enabled via row selector 256. Thus, processor 253 controls writing to memory 252 by writing a0,a1 to row selector 256, thereby write enabling the selected row. The value subsequently written to row i by processor 253 is stored in respective capacitors 252C(i,j) of row i.

Processor 253 enables writing or reading values to and from memory 252 via RAS 258. When RAS 258 is set to 0, memory 252 is read-enabled for selected memory cells 252(i,j) of row i. By setting RAS 258 to 0, MUX 266 is connected to the output of memory 252 via latch 260, data selector 254 and tri-state bus 262. Memory cells 252(i,j) activated by row selector 256 and data selector 254 are read-enabled. Processor 253 reads the contents of the read-activated memory cells 252(i,j) via tri-state bus 262.

When RAS 258 is set to 1, memory 252 is write-enabled for selected memory cells 252(i,j). By setting RAS 258 to 1, column buses 252Col(j) are connected to data selector 254 via latch 260 and write-diodes 268(j). Processor 253 writes values to memory cells 252(i,j) activated by row selector 256 and data selector 254, via latch 260, write diodes 268(j), MUX 266 and column buses 252Col(j). Capacitors 252C(i,j) of memory cells 252(i,j) of row i are thus selected, and store the value received from processor 253. Once a value of 1 has been written to a specific memory cell 252(i,j), thereby charging respective capacitor 252C(i,j) of memory cell 252(i,j), subsequent writes to the same memory cell 252(i,j), whether 0 or 1, do not affect the state of the capacitor, thereby implementing an OR=instruction. Since this operator is an USCAE operator, the order of execution does not affect the final state of memory array 252.

To reset memory cells 252(i,j) of memory array 252 back to zero, processor 253 selects the row for resetting by writing values a0,a1 to row selector 256. Processor 253 sets RAS 258 to 1, thereby write-enabling memory cells 252(i,j). Processor 253 writes a zero to the memory cell 252(i,j) selected by row selector 256 and data selector 254. Capacitor 252C(i,j) of selected memory cell 252(i,j) is electrically coupled to clear line 264 active low, and discharges.

Reference is now made to FIGS. 3A-3G, which together form a schematic illustration of a system, generally referenced 300, for implementing multiple concurrent OR= instructions on a shared DRAM memory unit accessed concurrently by multiple core processors, constructed and operative in accordance with another embodiment of the disclosed technique. System 300 includes four independent DRAM controllers 320(1), 320(2), 320(3), and 320(4), each of which serves a separate CPU processor 322(1), 322(2), 322(3), and 320(4), respectively. System 300 further includes a shared memory 302 configured for concurrent reading and writing by CPU processor 322(1), 322(2), 322(3), and 320(4) via independent DRAM controllers 320(1), 320(2), 320(3), and 320(4), respectively. Shared dynamic memory 302 is formed from an array of multiple memory cells C(i,j), corresponding to row i and column j. Each of independent DRAM controllers 320(1), 320(2), 320(3), and 320(4) is provided with a connectivity array 303(1), 303(2), 303(3), and 303(4), respectively. Connectivity arrays 303(1), 303(2), 303(3), and 303(4) provide electrical communication between each of independent DRAM controllers 320(1), 320(2), 320(3), and 320(4) and shared dynamic memory 302, such that each of processing cores 322(1), 322(2), 322(3), and 322(4) can concurrently read and write to shared dynamic memory 302. A description of the connectivity between independent DRAM controllers 320(1), 320(2), 320(3), and 320(4) and shared memory 302 is provided in greater detail below with respect to FIG. 3B.

Each of DRAM controllers 320(1), 320(2), 320(3), and 320(4) is substantially similar to system 200 of FIG. 2. The description of DRAM controller 320(1) that follows is to be understood as relevant to each of DRAM controllers 320(2), 320(3), and 320(4), where the index "1" may be substituted with 2, 3, or 4, respectively. In particular, DRAM controller 320(1) includes a tristate bus, a data selector 304(1), a latch 310(1), a MUX 316(1), a RAS 308(1), and a row selector 306(1), the connectivity and functionality of which with respect to shared memory 302 is substantially similar to that described above with respect to FIG. 2, with the exception that each capacitor is shared by the DRAM controllers 320(1), 320(2), 320(3), and 320(4). Thus, processor 322(1) reads and writes to any one of memory cell(i,j) via DRAM controller 320(1), as described above in FIG. 2. Accordingly, since each of processing cores 322(1), 322(2), 322(3), and 322(4) is coupled to shared memory 302 via DRAM controllers 320(1), 320(2), 320(3), and 320(4), respectively, each of processing cores 322(1), 322(2), 322(3), and 322(4) reads and writes concurrently to any one of memory cells(i,j) of shared memory 302.

Figure 3A:
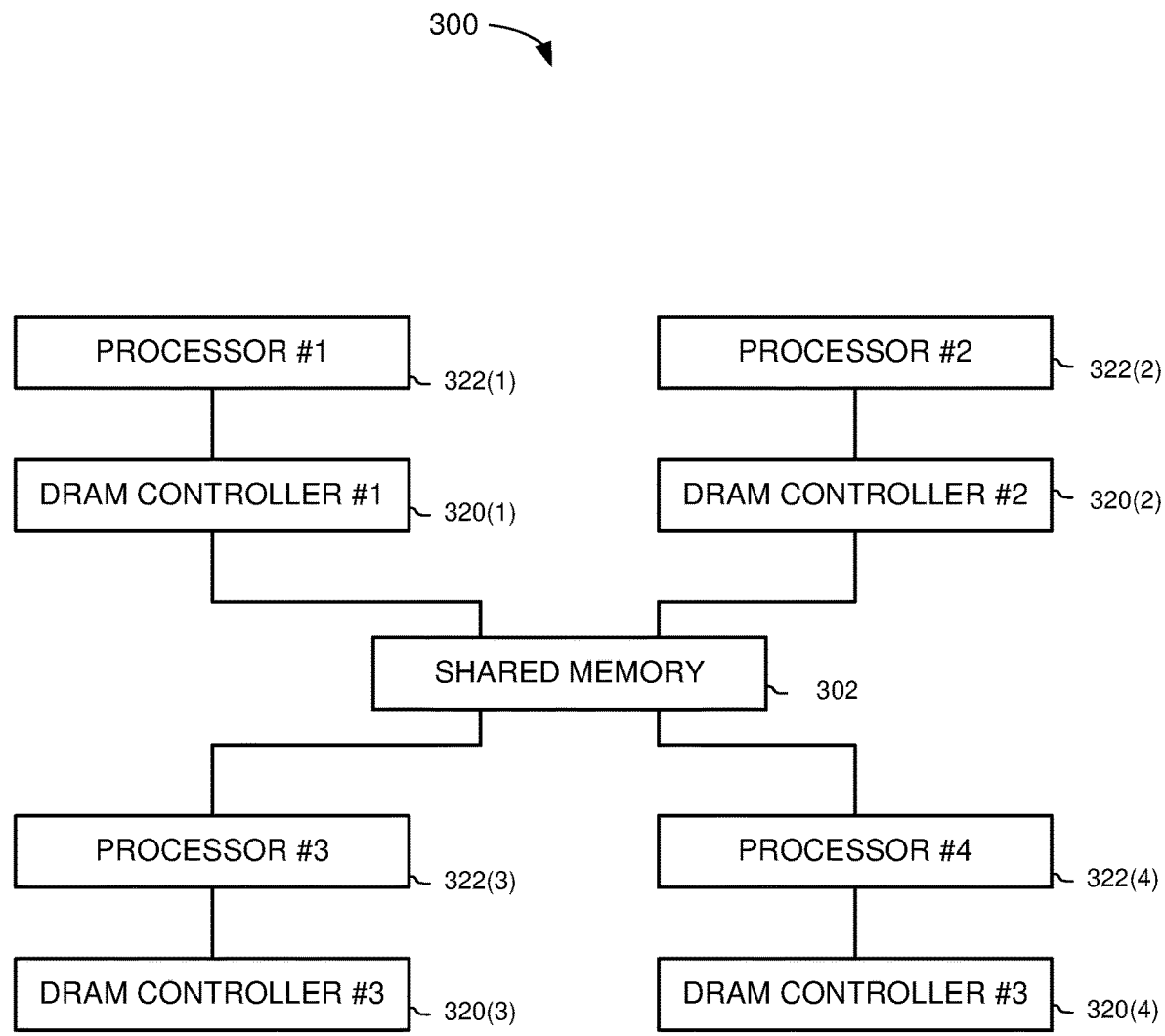
FIGS. 3A-3G, together, are a schematic illustration of a system for implementing concurrent OR= instructions on a DRAM memory unit accessed concurrently by multiple core processors, constructed and operative in accordance with another embodiment of the disclosed technique.
Figure 3B:
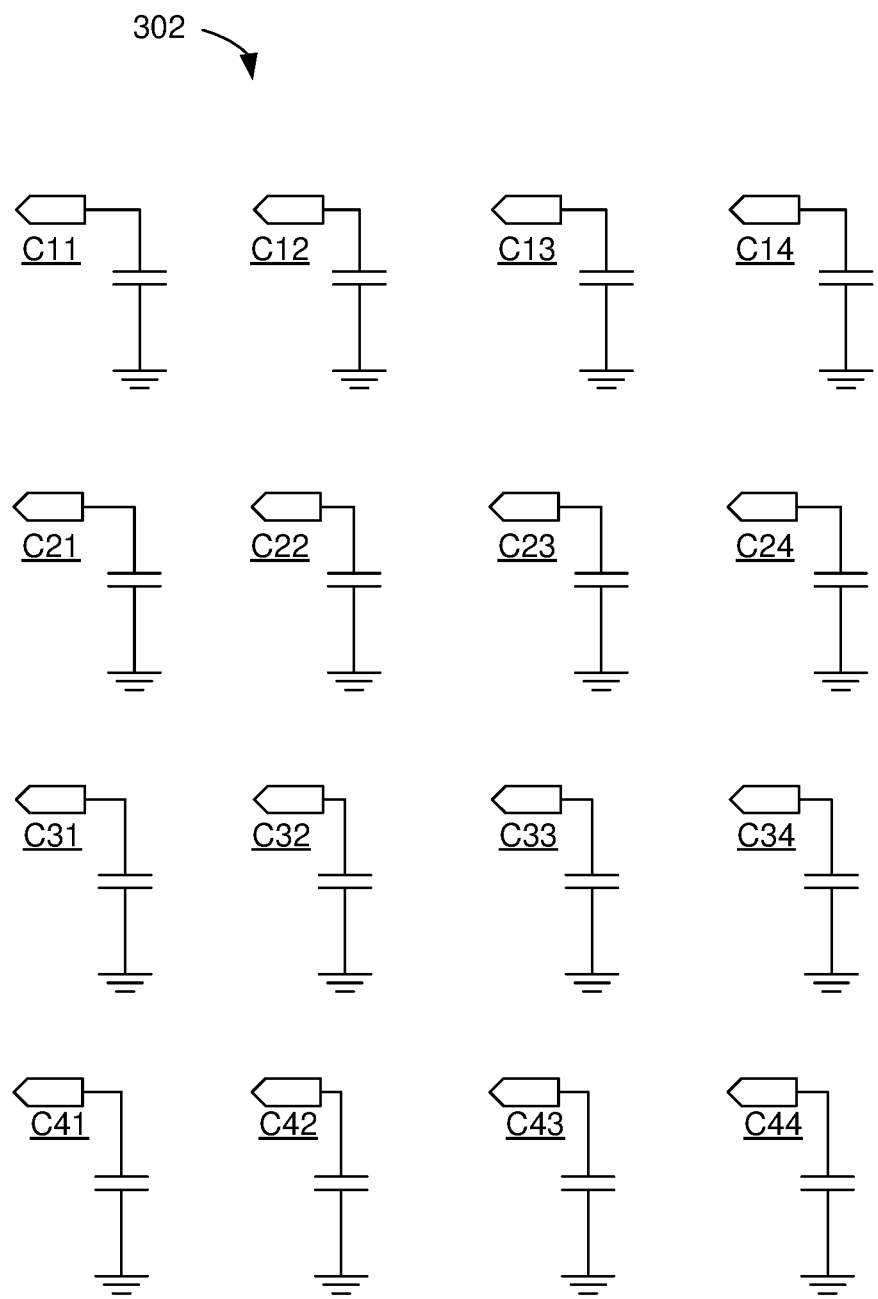
Figure 3C:
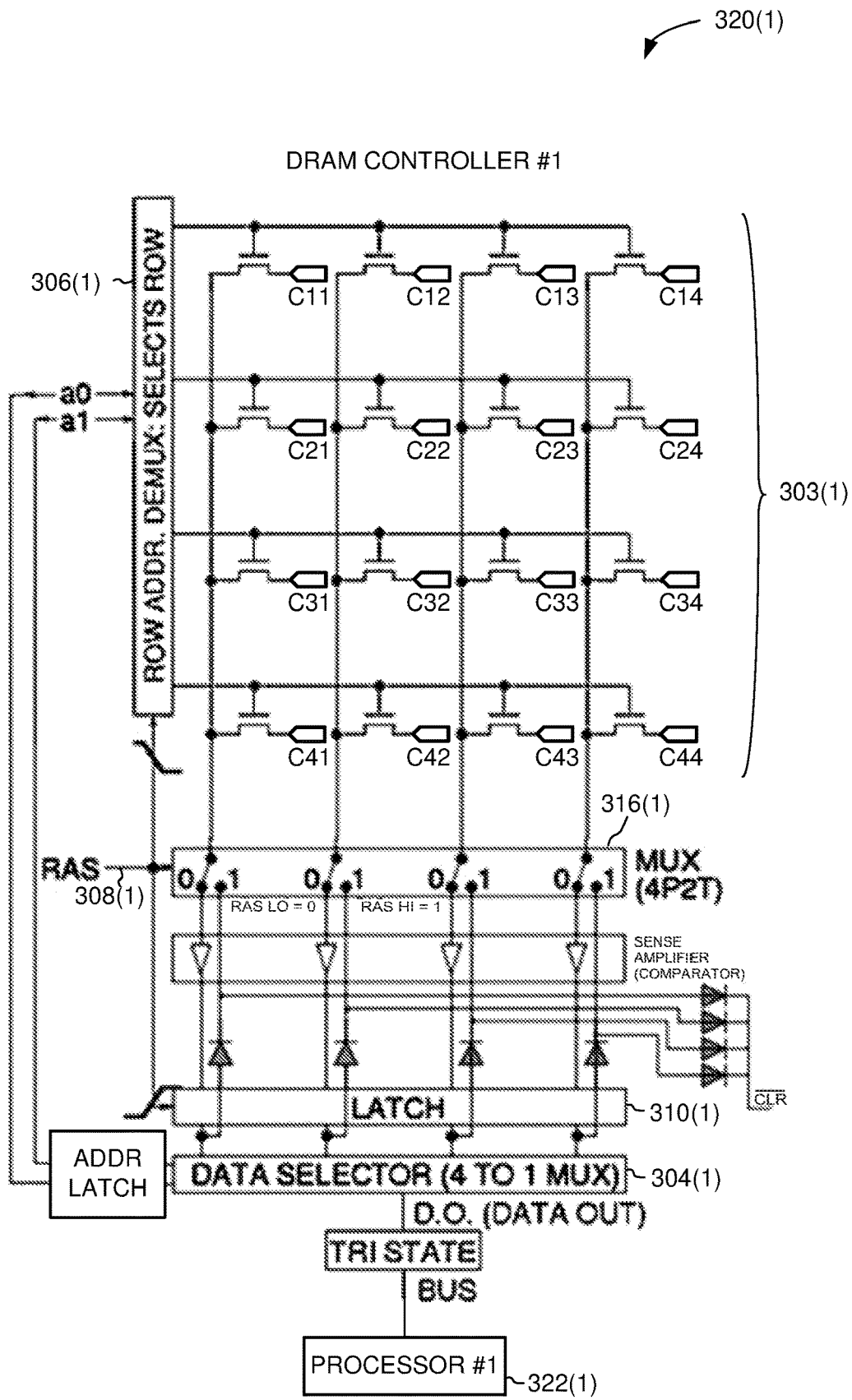
Figure 3D:
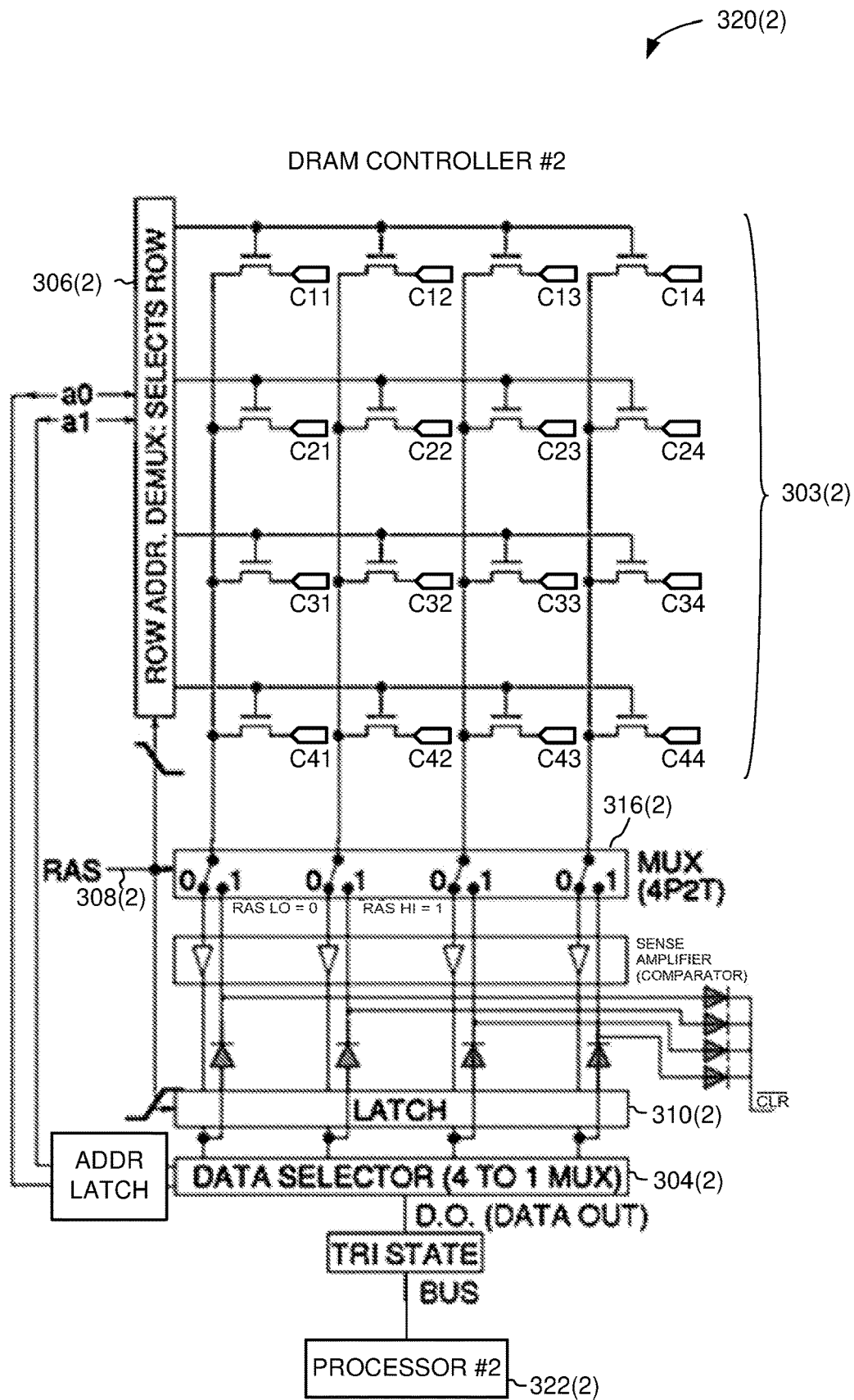
Figure 3E:
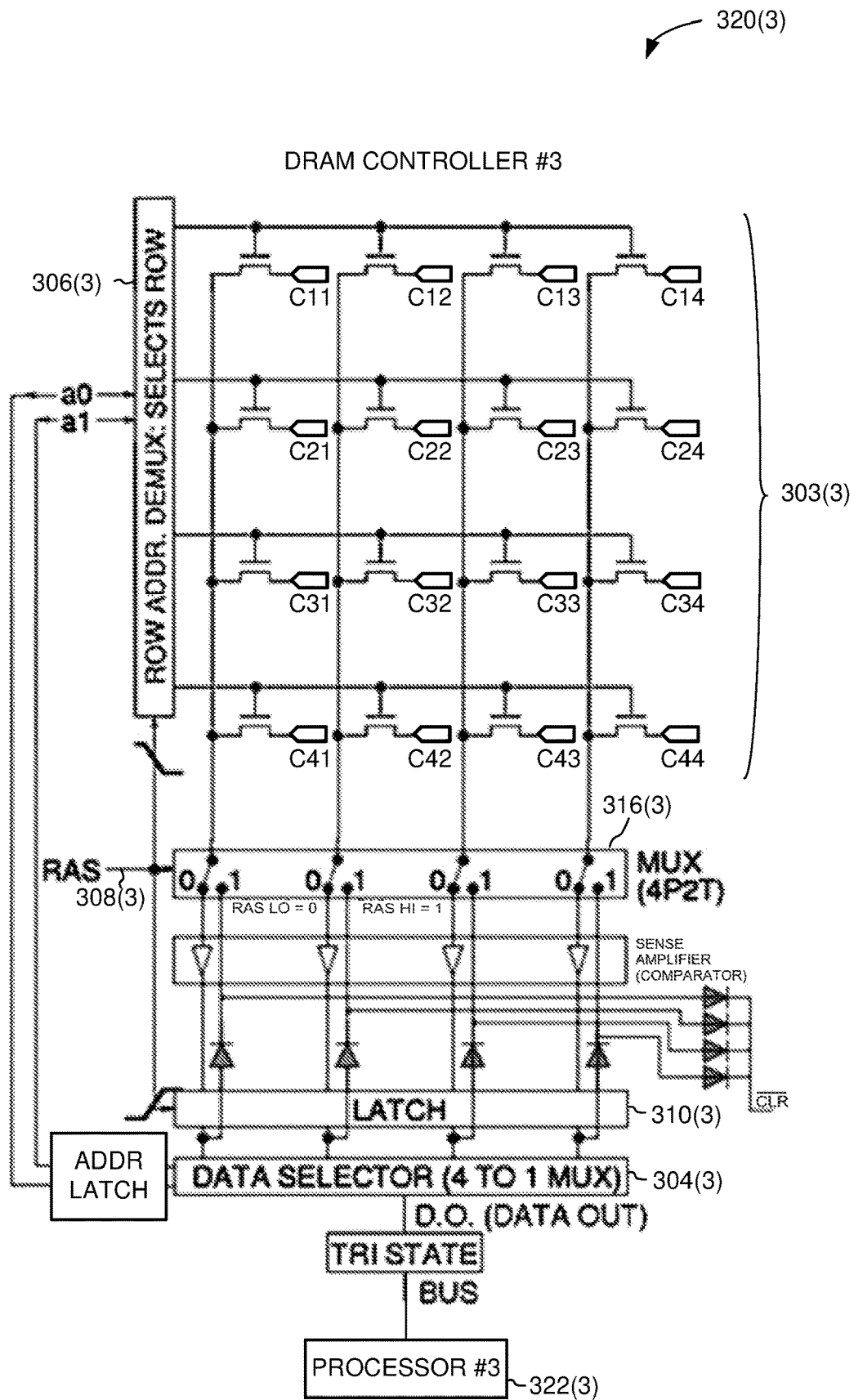
Figure 3F:
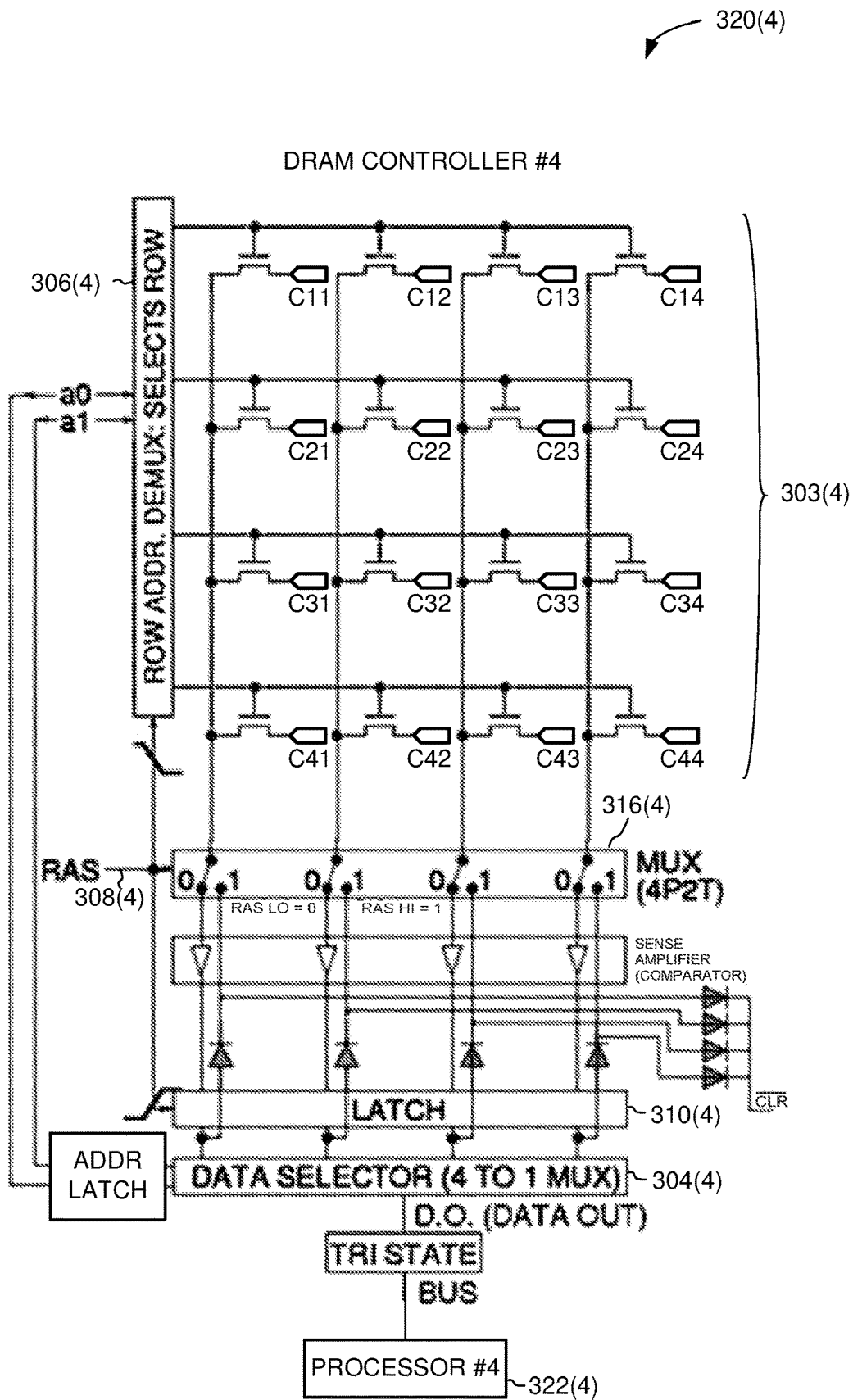
Figure 3G:
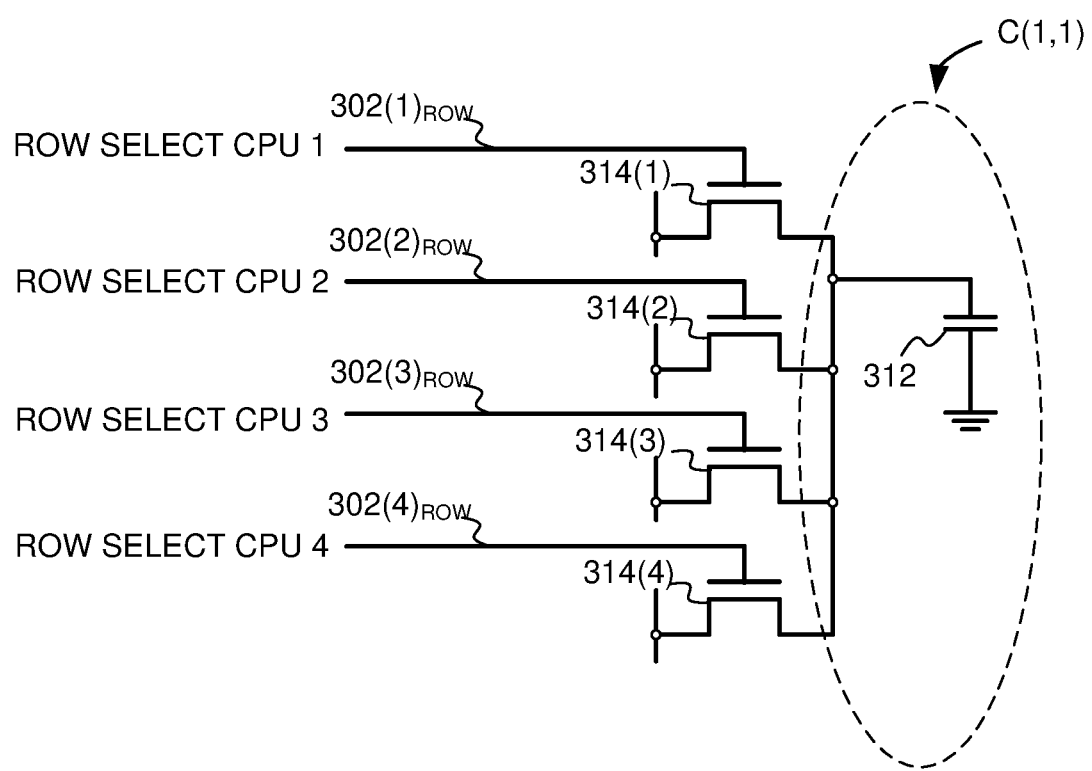

Reference is now made to FIG. 3G which illustrates a zoomed-in view of memory cell C(1,1) of shared memory 302, corresponding to the memory cell positioned at row 1, column 1. Memory cell C(1,1) is understood to be representative of each memory cell(i,j) of shared memory 302. Thus the description that follows for memory cell C(1,1) is understood to be relevant to each memory cell(i,j) of shared memory 302. Row enable line $303(1)_{ROW}$ and switch 314(1) are integral to connectivity array 303(1), providing connectivity between processing core 322(1) and memory cell C(1,1); Row enable line $303(2)_{ROW}$ and switch 314(2) are integral to connectivity array 303(2), providing connectivity between processing core 322(2) and memory cell C(1,1); Row enable line $303(3)_{ROW}$ and switch 314(3) are integral to connectivity array 303(3), providing connectivity between processing core 322(3) and memory cell C(1,1); Row enable line $303(4)_{ROW}$ and switch 314(4) are integral to connectivity array 303(4), providing connectivity between processing core 322(4) and memory cell C(1,1).

Memory cell C(1,1) includes a capacitor 312. Switches 314(1), 314(2), 314(3), and 314(4) are each electrically coupled to one terminal of capacitor 312. The other terminal of capacitor 312 is electrically coupled to ground or a reference voltage. The gate of switch 314(1) is coupled, via row enable line $303(1)_{ROW}$, to row selector 306(1) controllable by processing core 322(1); the gate of switch 314(2) is coupled, via row enable line $303(2)_{ROW}$, to row selector 306(2) controllable by processing core 322(2); the gate of switch 314(3) is coupled, via row enable line $303(3)_{ROW}$, to row selector 306(3) controllable by processing core 322(3); and the base of switch 314(4) is coupled, via row enable line $303(4)_{ROW}$, to row selector 306(4) controllable by processing core 322(4). Thus, memory cell C(1,1) is simultaneously electrically coupled to each of row selectors 306(1), 306(2), 306(3), and 306(4) via switches 314(1), 314(2), 314(3), and 314(4), controlled by processing cores 322(1), 322(2), 322(3), and 322(4), respectively.

The operation of the above circuit is substantially similar to system 200 of FIG. 2 with the noted exception that four independent processing cores 322(1), 322(2), 322(3), and 322(4) can concurrently read and write to shared memory 302. It is also noted that while the embodiments described in conjunction with FIGS. 1A-1D, included a feedback loop in the memory cells, the embodiments described in conjunction with FIGS. 2 and 3A-3G there is no feedback loop in the memory cells.

Additional Embodiments

1) It is noted that by interpreting zero voltage values as true and non-zero voltages as false, one or more of the above embodiments for implementing OR=operations may be modified to implement AND=operations on a shared memory. This is opposite to the interpretation for the OR=operation in which zero voltage is interpreted as false and non-zero voltage is interpreted as true.

2) First a clarification regarding FIGS. 1A, 1B and 1C. The values received by the memory cells are the logical ANDs of the data to be written with the corresponding write enable signals. In these diagrams the logical ANDs are denoted by DataW_Wen0 and DataW_Wen1. Thus, in these memory cells, there are no separate lines for the data to be written and the write enable signal. This may be done since with OR=, writing zero to a memory cell, does not change the contents of the memory cell. Furthermore, it is possible to modify FIGS. 1A, 1B and 1C so that there are no external read enable lines Ren0, Ren1 as follows. The lines DataW_Wen0 and DataW_Wen1 would be renamed RW0, RW1 respectively. For i=0, 1; RWi=0 means a read is to be performed RWi=1 means a write of one is to be performed to the OR-memory cell. RW0 is connected to the input of a first NOT gate whose output is connected to Ren0 which is now an internal line. Similarly, RW1 is connected to the input of a second NOT gate whose output is connected to Ren1 which is now an internal line. Thus for i=0, 1; when RWi=0 a read is performed and when RWi=1 a write of one is performed to the OR-memory cell. Thus, for each memory controller (or processor) there is just one line for initiating reads from, and writes of one to, the OR-memory cell; there being no separate line for the data to be written.

3) It is further noted that the diagram for OR-memory SRAM is similar to FIGS. 3A, 3B but flip-flops are used instead of capacitors. Also, there are no memory refresh circuits.

4) It is further noted that in diagrams 3A, 3B transistors were used to implement switches. Other technologies may be used to implement these switches.

It will be appreciated by persons skilled in the art that the disclosed technique is not limited to what has been particularly shown and described hereinabove. Rather the scope of the disclosed technique is defined only by the claims, which follow.

The invention claimed is:

1. A system for shared concurrent access to a memory cell, comprising:
 at least one shared memory cell;
 an evaluator coupled to said at least one shared memory cell, and
 configured to evaluate an expression for performing multiple concurrent composite assignments on said at least one shared memory cell; and
 a plurality of processing agents, coupled to an input of said evaluator,
 wherein said evaluator allows each of said plurality of processing agents to perform concurrent composite assignments on said at least one shared memory cell, wherein said composite assignments do not include a read operation of said at least one shared memory cell by said plurality of processing agents.

2. The system according to claim 1, wherein said evaluator performing said multiple concurrent composite assignments is external to said plurality of processing agents.

3. The system according to claim 1, wherein said evaluator enables access to a shared memory cell when allowing said plurality of processing agents to perform concurrent composite assignments on said at least one shared memory cell.

4. The system according to claim 1, wherein the values received by the at least one shared memory cell are the logical ANDs of data to be written with corresponding write enable lines.

5. The system according to claim 1 wherein at least two of said plurality of processing agents are processing threads that are executed concurrently by a single processing core.

6. The system according to claim 1, wherein at least two of said plurality of processing agents are independent processing cores.

7. The system according to claim 1, wherein said evaluator further receiving at the input thereof, via a feedback circuit, a current value of said at least one shared memory cell.

8. The system of claim 1, wherein a composite assignment in said concurrent composite assignments is one of:
 logical AND logical OR;
 logical XOR;
 addition;
 subtraction;
 multiplication;
 division;
 exponent;
 modulus addition;
 modulus subtraction.

9. A system for shared concurrent access to a memory cell, comprising:
 at least one shared memory cell;
 a logic circuit coupled to said at least one shared memory cell, and configured to perform one of OR= and AND= multiple concurrent composite assignments on said at least one shared memory cell; and
 a plurality of processing agents coupled to said logic circuit,
 wherein said logic circuit allows each of said plurality of processing agents to perform concurrent composite assignments on said at least one shared memory cell, wherein said composite assignment does not include a read operation of said at least one shared memory cell by said plurality of processing agents.

10. The system of claim 9, wherein said at least one memory cell does not include a feedback circuit for receiving a current value of said at least one shared memory cell.

11. The system according to claim 9, where for a first bit x and a second bit y, a composite assignment of said composite assignments is x OR=y, said composite assignment implemented by a statement selected from the group consisting of:
 if y==1 then x=1;
 if y==1 then x=1 else x=x;
 if y==1 then x=y; and
 if y==1 then x=y else x=x.

12. The system according to claim 9, where for a first bit x and a second bit y, a composite assignment of said composite assignments is x AND=y, said composite assignment implemented by a statement selected from the group consisting of:
 if y==0 then x=0;
 if y==0 then x=0 else x=x;
 if y==0 then x=y; and
 if y==0 then x=y else x=x.

\* \* \* \* \*